(12) United States Patent
Sheppard et al.

(10) Patent No.: US 8,823,057 B2
(45) Date of Patent: Sep. 2, 2014

(54) SEMICONDUCTOR DEVICES INCLUDING IMPLANTED REGIONS FOR PROVIDING LOW-RESISTANCE CONTACT TO BURIED LAYERS AND RELATED DEVICES

(75) Inventors: Scott T. Sheppard, Chapel Hill, NC (US); Alexander V. Suvorov, Durham, NC (US)

(73) Assignee: Cree, Inc., Durham, NC (US)

( * ) Notice: Subject to any disclaimer, the term of this patent is extended or adjusted under 35 U.S.C. 154(b) by 300 days.

(21) Appl. No.: 11/556,871

(22) Filed: Nov. 6, 2006

(65) Prior Publication Data
US 2008/0121895 A1   May 29, 2008

(51) Int. Cl.
*H01L 29/66* (2006.01)

(52) U.S. Cl.
USPC ..... 257/192; 257/194; 257/196; 257/E29.246

(58) Field of Classification Search
USPC ............. 257/192, 194, 195, 196, E29.246; 438/167
See application file for complete search history.

(56) References Cited

U.S. PATENT DOCUMENTS

| | | | |
|---|---|---|---|
| 3,919,656 A | 11/1975 | Sokal et al. |
| 3,955,160 A | 5/1976 | Duffy |
| 4,424,525 A | 1/1984 | Mimura |
| 4,471,366 A | 9/1984 | Delagebeaudeuf et al. |
| 4,551,905 A | 11/1985 | Chao et al. |
| 4,727,403 A | 2/1988 | Hilda et al. |
| 4,755,867 A | 7/1988 | Cheng |
| 4,788,156 A | 11/1988 | Stoneham et al. |
| 4,912,063 A | 3/1990 | Davis et al. |
| 4,912,064 A | 3/1990 | Kong et al. |
| 4,946,547 A | 8/1990 | Palmour et al. |
| 4,947,232 A | 8/1990 | Ashida et al. |
| 5,011,549 A | 4/1991 | Kong et al. |
| 5,053,348 A | 10/1991 | Mishra et al. |
| 5,057,897 A | 10/1991 | Nariani et al. |
| 5,128,279 A | 7/1992 | Nariani et al. |
| 5,155,062 A | 10/1992 | Coleman |
| 5,172,197 A | 12/1992 | Nguyen et al. |
| 5,192,987 A | 3/1993 | Khan et al. |

(Continued)

FOREIGN PATENT DOCUMENTS

| EP | 0069429 A | 1/1983 |
|---|---|---|
| EP | 0 334 006 A1 | 9/1989 |

(Continued)

OTHER PUBLICATIONS

U.S. Appl. No. 11/169,378, filed Jun. 29, 2005, Ring et al.

(Continued)

*Primary Examiner* — Robert Huber
(74) *Attorney, Agent, or Firm* — Myers Bigel Sibley & Sajovec, PA

(57) ABSTRACT

Methods of fabricating a semiconductor device include forming a first semiconductor layer of a first conductivity type and having a first dopant concentration, and forming a second semiconductor layer on the first semiconductor layer. The second semiconductor layer has a second dopant concentration that is less than the first dopant concentration. Ions are implanted into the second semiconductor layer to form an implanted region of the first conductivity type extending through the second semiconductor layer to contact the first semiconductor layer. A first electrode is formed on the implanted region of the second semiconductor layer, and a second electrode is formed on a non-implanted region of the second semiconductor layer. Related devices are also discussed.

43 Claims, 4 Drawing Sheets

(56) References Cited

U.S. PATENT DOCUMENTS

| | | | |
|---|---|---|---|
| 5,196,359 | A | 3/1993 | Shih et al. |
| 5,200,022 | A | 4/1993 | Kong et al. |
| 5,204,278 | A | 4/1993 | Imamura et al. |
| 5,210,051 | A | 5/1993 | Carter, Jr. |
| 5,223,458 | A | 6/1993 | Shanfield et al. |
| 5,236,547 | A * | 8/1993 | Takahashi et al. .......... 438/498 |
| 5,254,862 | A * | 10/1993 | Kalyankjumar et al. ....... 257/77 |
| 5,265,267 | A | 11/1993 | Martin et al. |
| 5,270,554 | A | 12/1993 | Palmour |
| 5,292,501 | A | 3/1994 | Degenhardt et al. |
| 5,296,395 | A | 3/1994 | Khan et al. |
| 5,298,445 | A | 3/1994 | Asano |
| 5,306,662 | A | 4/1994 | Nakamura et al. |
| 5,343,054 | A * | 8/1994 | Maroney et al. ............. 257/184 |
| RE34,861 | E | 2/1995 | Davis et al. |
| 5,389,571 | A | 2/1995 | Takeuchi et al. |
| 5,393,993 | A | 2/1995 | Edmond et al. |
| 5,399,886 | A | 3/1995 | Hasegawa |
| 5,523,589 | A | 6/1996 | Edmond et al. |
| 5,569,937 | A | 10/1996 | Bhatnagar et al. |
| 5,569,943 | A | 10/1996 | Koscica et al. |
| 5,576,589 | A | 11/1996 | Dreifus et al. |
| 5,592,501 | A | 1/1997 | Edmond et al. |
| 5,686,737 | A | 11/1997 | Allen |
| 5,701,019 | A | 12/1997 | Matsumoto et al. |
| 5,705,827 | A | 1/1998 | Baba et al. |
| 5,739,554 | A | 4/1998 | Edmond et al. |
| 5,796,127 | A | 8/1998 | Hayafuji et al. |
| 5,885,860 | A | 3/1999 | Weitzel et al. |
| 5,900,641 | A | 5/1999 | Hara et al. |
| 5,929,467 | A | 7/1999 | Kawai et al. |
| 5,946,547 | A | 8/1999 | Kim et al. |
| 5,990,531 | A | 11/1999 | Taskar et al. |
| 6,020,226 | A * | 2/2000 | Cerny et al. .................. 438/167 |
| 6,025,613 | A | 2/2000 | Bito et al. |
| 6,025,614 | A * | 2/2000 | Ogawa et al. ................. 257/192 |
| 6,028,328 | A | 2/2000 | Riechert et al. |
| 6,046,464 | A | 4/2000 | Schetzina |
| 6,057,564 | A | 5/2000 | Rennie |
| 6,060,734 | A | 5/2000 | Kunihiro |
| 6,063,186 | A | 5/2000 | Irvine et al. |
| 6,064,082 | A | 5/2000 | Kawai et al. |
| 6,086,673 | A | 7/2000 | Molnar |
| 6,100,571 | A | 8/2000 | Mizuta et al. |
| 6,140,169 | A | 10/2000 | Kawai et al. |
| 6,150,680 | A | 11/2000 | Eastman et al. |
| 6,177,685 | B1 | 1/2001 | Teraguchi et al. |
| 6,217,662 | B1 | 4/2001 | Kong et al. |
| 6,218,680 | B1 | 4/2001 | Carter, Jr. et al. |
| 6,242,327 | B1 | 6/2001 | Yokoyama et al. |
| 6,246,076 | B1 | 6/2001 | Lipkin et al. |
| 6,265,727 | B1 | 7/2001 | Kozodoy et al. |
| 6,285,866 | B1 | 9/2001 | Lee et al. |
| 6,297,092 | B1 | 10/2001 | Rudeck et al. |
| 6,297,522 | B1 | 10/2001 | Kordina et al. |
| 6,300,706 | B1 | 10/2001 | Grudkowski et al. |
| 6,307,232 | B1 | 10/2001 | Akiyama et al. |
| 6,316,793 | B1 | 11/2001 | Sheppard et al. |
| 6,346,451 | B1 | 2/2002 | Simpson et al. |
| 6,396,080 | B2 | 5/2002 | Carter, Jr. et al. |
| 6,403,982 | B2 | 6/2002 | Carter, Jr. et al. |
| 6,429,467 | B1 | 8/2002 | Ando |
| 6,429,468 | B1 | 8/2002 | Hsu et al. |
| 6,445,038 | B1 | 9/2002 | Tihanyi |
| 6,448,648 | B1 | 9/2002 | Boos |
| 6,465,814 | B2 | 10/2002 | Kasahara et al. |
| 6,468,878 | B1 | 10/2002 | Petruzzello et al. |
| 6,475,857 | B1 | 11/2002 | Kim et al. |
| 6,483,135 | B1 | 11/2002 | Mizuta et al. |
| 6,495,409 | B1 | 12/2002 | Manfra et al. |
| 6,495,852 | B1 | 12/2002 | Mouri |
| 6,498,111 | B1 | 12/2002 | Kapolnek et al. |
| 6,504,235 | B2 | 1/2003 | Schmitz et al. |
| 6,515,316 | B1 | 2/2003 | Wojtowicz et al. |
| 6,518,637 | B1 | 2/2003 | Thompson et al. |
| 6,548,333 | B2 | 4/2003 | Smith |
| 6,555,946 | B1 | 4/2003 | Finder et al. |
| 6,559,513 | B1 | 5/2003 | Miller et al. |
| 6,586,781 | B2 | 7/2003 | Wu et al. |
| 6,586,813 | B2 | 7/2003 | Nagahara |
| 6,620,688 | B2 | 9/2003 | Woo et al. |
| 6,639,255 | B2 | 10/2003 | Inoue et al. |
| 6,677,642 | B2 | 1/2004 | Peake et al. |
| 6,686,616 | B1 | 2/2004 | Allen et al. |
| 6,690,042 | B2 | 2/2004 | Khan et al. |
| 6,735,492 | B2 | 5/2004 | Conrad et al. |
| 6,768,147 | B2 | 7/2004 | Yokoyama et al. |
| 6,797,069 | B2 | 9/2004 | Paisley et al. |
| 6,844,592 | B2 | 1/2005 | Yamaguchi et al. |
| 6,849,882 | B2 | 2/2005 | Chavarkar et al. |
| 6,852,615 | B2 | 2/2005 | Micovic et al. |
| 6,896,738 | B2 | 5/2005 | Sumakeris et al. |
| 6,982,204 | B2 | 1/2006 | Saxler et al. |
| 7,030,428 | B2 | 4/2006 | Saxler |
| 7,033,912 | B2 | 4/2006 | Saxler |
| 7,045,404 | B2 | 5/2006 | Sheppard et al. |
| 7,075,125 | B2 | 7/2006 | Saito et al. |
| 7,084,441 | B2 | 8/2006 | Saxler |
| 7,135,715 | B2 | 11/2006 | Saxler |
| 2001/0015446 | A1 | 8/2001 | Inoue et al. |
| 2001/0020700 | A1 | 9/2001 | Inoue et al. |
| 2001/0023964 | A1 | 9/2001 | Wu et al. |
| 2001/0035695 | A1 | 11/2001 | Kadota et al. |
| 2001/0040246 | A1 | 11/2001 | Ishii |
| 2002/0008241 | A1 | 1/2002 | Edmond et al. |
| 2002/0017696 | A1 | 2/2002 | Nakayama et al. |
| 2002/0066908 | A1 | 6/2002 | Smith |
| 2002/0079508 | A1 | 6/2002 | Yoshida |
| 2002/0090454 | A1 | 7/2002 | Paisley et al. |
| 2002/0113668 | A1 | 8/2002 | Tanaka et al. |
| 2002/0158707 | A1 | 10/2002 | Noguchi |
| 2002/0167023 | A1 | 11/2002 | Charvarkar et al. |
| 2002/0170491 | A1 | 11/2002 | Mueller |
| 2003/0006437 | A1 | 1/2003 | Mizuta et al. |
| 2003/0020092 | A1 | 1/2003 | Parikh et al. |
| 2003/0022412 | A1 | 1/2003 | Higgins et al. |
| 2003/0030119 | A1 | 2/2003 | Higgins et al. |
| 2003/0102482 | A1 | 6/2003 | Saxler |
| 2003/0123829 | A1 | 7/2003 | Taylor |
| 2003/0145784 | A1 | 8/2003 | Thompson et al. |
| 2003/0161181 | A1 | 8/2003 | Saito et al. |
| 2004/0016965 | A1 * | 1/2004 | Ui et al. ....................... 257/335 |
| 2004/0021152 | A1 | 2/2004 | Nguyen et al. |
| 2004/0029330 | A1 | 2/2004 | Hussain et al. |
| 2004/0036086 | A1 | 2/2004 | Khan et al. |
| 2004/0061129 | A1 | 4/2004 | Saxler et al. |
| 2004/0070003 | A1 | 4/2004 | Gaska et al. |
| 2004/0079965 | A1 | 4/2004 | Tamura et al. |
| 2004/0149993 | A1 | 8/2004 | McClure et al. |
| 2004/0241970 | A1 | 12/2004 | Ring |
| 2005/0133816 | A1 | 6/2005 | Fan et al. |
| 2005/0170574 | A1 * | 8/2005 | Sheppard et al. ............. 438/172 |
| 2005/0173728 | A1 | 8/2005 | Saxler |
| 2005/0189651 | A1 * | 9/2005 | Hirose et al. .................. 257/745 |
| 2005/0258431 | A1 | 11/2005 | Smith et al. |
| 2005/0258451 | A1 | 11/2005 | Saxler et al. |
| 2006/0011915 | A1 | 1/2006 | Saito et al. |
| 2006/0017064 | A1 | 1/2006 | Saxler et al. |
| 2006/0019435 | A1 | 1/2006 | Sheppard et al. |
| 2006/0043415 | A1 | 3/2006 | Okamoto et al. |
| 2006/0071247 | A1 | 4/2006 | Chen et al. |
| 2006/0108606 | A1 | 5/2006 | Saxler et al. |
| 2006/0118809 | A1 | 6/2006 | Parikh et al. |
| 2006/0118823 | A1 | 6/2006 | Parikh et al. |
| 2006/0145761 | A1 | 7/2006 | Pribble et al. |
| 2006/0202272 | A1 | 9/2006 | Wu et al. |
| 2006/0208280 | A1 | 9/2006 | Smith et al. |
| 2006/0226412 | A1 | 10/2006 | Saxler |

(56) References Cited

U.S. PATENT DOCUMENTS

| | | |
|---|---|---|
| 2006/0226413 A1 | 10/2006 | Saxler |
| 2006/0244010 A1 | 11/2006 | Saxler |
| 2006/0244011 A1 | 11/2006 | Saxler |
| 2009/0250785 A1* | 10/2009 | Krutsick et al. ............. 257/526 |

FOREIGN PATENT DOCUMENTS

| | | |
|---|---|---|
| EP | 0373 606 | 12/1989 |
| EP | 0 563 847 A2 | 10/1993 |
| EP | 0792028 A2 | 8/1997 |
| EP | 1336989 A2 | 8/2003 |
| JP | 58197910 | 11/1983 |
| JP | 59-004084 A | 1/1984 |
| JP | 05021793 | 1/1993 |
| JP | 05183381 | 7/1993 |
| JP | 10-050982 | 2/1998 |
| JP | 10-223653 A | 8/1998 |
| JP | 10223653 A * | 8/1998 |
| JP | 11-097452 A | 4/1999 |
| JP | 11261053 | 9/1999 |
| JP | 2001085670 | 3/2001 |
| JP | 2001230407 A | 8/2001 |
| JP | 2002016087 A | 1/2002 |
| JP | 2004-146588 A | 5/2004 |
| JP | 2004-342810 | 12/2004 |
| JP | 2005-225693 A | 8/2005 |
| JP | 2005-311029 A | 11/2005 |
| WO | WO 93/23877 A1 | 11/1993 |
| WO | WO 00/04587 A2 | 1/2000 |
| WO | WO 01/57929 A1 | 8/2001 |
| WO | WO 03/038905 A2 | 5/2003 |
| WO | WO 03/049193 A1 | 6/2003 |
| WO | WO 2004/008495 | 1/2004 |
| WO | WO 2004/068590 A1 | 8/2004 |

OTHER PUBLICATIONS

U.S. Appl. No. 09/715,576, filed Mar. 3, 2003.
Masaki et al., "Structural and Electrical Properties of $SiN_x$:H Films," *J. Appl. Phys.* vol. 73 (10), May 15, 1993, pp. 5088-5094.
Martil et al., "Rapid Thermally Annealed Plasma Deposited $SiN_x$:H Thin Films: Application to Metal-Insulator-Semiconductor Structures with Si, $In_{0.53}Ga_{0.47}As$, and InP," *J. Appl. Phys*, vol. 94, (4), Aug. 15, 2003, pp. 2642-2653.
Derluyn et al., "Improvement of AlGaN/GaN High Electron Mobility Transistor Structures by in situ deposition of $Si_3N_4$ Surface Layer," *J. Appl. Phys.*, vol. 98, 054501, Sep. 2, 2005.
Kotecki et al., "Hydrogen Incorporation in Silicon Nitride Films Deposited by Remote Electron-Cyclotron-Resonance Chemical Vapor Deposition," *J. Appl. Phys.*, vol. 77 (3), Feb. 1, 1995, pp. 1284-1293.
Park, et al., "Deposited Silicon Nitride with Low Electron Trapping Rates," *J. Appl. Phys.*, vol. 74 (1), Jul. 1, 1993, pp. 381-386.
Wang, et al. "Comparison of the Effect of Gate Dielectric Layer on 2DEG Carrier Concentration in Strained AlGaN/GaN Heterostructure," *Mater. Res. Soc. Symp. Proc.*, vol. 831, 2005.
Leys, et al. "Surface Stabilization for Higher Performance ALGaN/GaN HEMT with in-situ MOVPE SIN," *Mater Res. Soc. Symp. Proc.*, vol. 831, 2005.
Wetzel, et al. "GaN, AlN, InN, and Their Alloys," Symposium E, held Nov. 29-Dec. 3, 2004, to be published in vol. 831, Mat. Res. Soc. Symp. Proc. (Publication date of Abstracts unknown).
Sheppard et al., "Improved 10-GHz Operation of GaN/AlGaN HEMTs on Silicon Carbide", *Materials Science Forum*, vols. 338-342 (2000) pp. 1643-1646.
Sheppard et al., "High Power Demonstration at 10 GHz with GaN/AlGaN HEMT Hybrid Amplifiers", Presented at the 58th DRC, Denver, CO (Jun. 2000) 20 pages.
Ng, K.N., "Interdigital Transducer", *Complete Guide to Semiconductor Devices*, Ch. 66 (2000) pp. 511-516.
Hagon et al. "Integrated Programmable Analog Matched Filters for Spread Spectrum Applications," IEEE Ultrasonics Symposium, 1973, pp. 333-335.
Stutzmann et al. "GaN-based heterostructures for sensor applications," *Diamond and Related Materials*, vol. 11, No. 3-6, Mar. 2002, pp. 886-891.
Takagaki et al. "Superhigh-frequency surface-acoustic-wave transducers using AlN layers grown on SiC substrates," *Applied Physics Letters*, vol. 81, No. 14, Sep. 30, 2002, pp. 2538-2540.
Tsubouchi et al. "Zero Temperature Coefficient Saw Delay Line on AlN Epitaxial Films," IEEE Ultrasonics Symposium, Atlanta, GA, 1983, pp. 299-310.
Invitation to Pay Additional Fees issued Aug. 31, 2004 for corresponding PCT application No. PCT/US2004/006232.
International Search Report and Written Opinion for PCT US2004/006232; date of mailing Nov. 11, 2004.
Coates et al. "Deposition of Silicon Nitride to Improve the Conversion Efficiency of Multicrystalline Silicon Solar Cells" *Proceedings of the 16th European Photovoltaic Solar Energy Conference*, Glasgow pp. 1279-1281 (2000).
Beaumont, B. et al., "Epitaxial Lateral Overgrowth of GaN," *Phys. Stat. Sol.* (b) 227, No. 1, pp. 1-43 (2001).
Ando et al., "10-W/mm AlGaN-GaN HFET With a Field Modulating Plate," *IEEE Electron Device Letters*, 24(5), pp. 289-291 (May 2003).
Chang et al., "AlGaN/GaN Modulation-Doped Field-Effect Transistors with an Mg-doped Carrier Confinement Layer," *Jpn. J. Appl. Phys.*, 42:3316-3319 (2003).
Chini et al., "Power and Linearity Characteristics of Field-Plagted Recessed-Gate AlGaN-GaN HEMTs," *IEEE Electron Device Letters*, 25(5), pp. 229-231 (May 2004).
Cho et al., "A New GaAs Field Effect Transistor (FET) with Dipole Barrier (DIB)," *Jpn. J. Appl. Phys.* 33:775-778 (1994).
Coffie et al., "Unpassivated p-GaN/AlGaN/GaN HEMTs with 7.1 W/MMF at 10 GHz", *Electronic Letters online* No. 20030872, 39(19), (Sep. 18, 2003).
Gaska et al., "Self-Heating in High-Power AlGaN/GaN HFET's," *IEEE Electron Device Letters*, 19(3), pp. 89-91 (Mar. 1998).
Hikita et al., "350V/150A AlGaN/GaN Power HFET on Silicon Substrate With Source—via Grounding (SVG) Structure," *Electron Devices Meeting*, 2004, pp. 803-806, IEDM Technical Digest. IEEE International (Dec. 2004).
Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).
Kanamura et al., "A 100-W High-Gain AlGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).
Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).
Kashahara et al., "Ka-ban 2.3W Power AlGaN/GaN Heterojunction FET," *IEDM Technical Digest*, pp. 677-680 (2002).
Komiak et al., "Fully Monolithic 4 Watt High Efficiency Ka-band Power Amplifier," *IEEE MTT-S International Microwave Symposium Digest*, vol. 3, pp. 947-950 (1999).
Küsters et al., "Double-Heterojunction Lattice-Matched and Pseudomorphic InGaAs HEMT with δ-Doped InP Supply Layers and p-InP Barier Enhancement Layer Grown by LP-MOVPE," *IEEE Electron Device Letters*, 14(1), (Jan. 1993).
Manfra et al., "Electron Mobility Exceeding 160 000 $cm^2$/V s in AlGaN/GaN Heterostructures Grown by Molecular-beam Epitaxy," *Applied Physics Letters*, 85(22), pp. 5394-5396 (Nov. 29, 2004).
Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).
Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).
Parikh et al., "Development of Gallium Nitride Epitaxy and Associated Material-Device Correlation for RF, Microwave and MM-wave Applications," Cree, Inc. (35 slides).

(56) References Cited

OTHER PUBLICATIONS

Saxler et al., "III-Nitride Heterostructures on High-Purity Semi-Insulating 4H-SiC Substrates for High-Power RF Transistors," International Workshop on Nitride Semiconductors (Jul. 19, 2004).
Shiojima et al., "Improved Carrier Confinement by a Buried p-Layer in the AlGaN/GaN HEMT Structure," *IEICE Trans. Electron.*, E83-C(12), (Dec. 2000).
"Thick AlN template on SiC substrate—Novel semi insulating substrate for GaN-based devices," © 2003 by TDI, Inc., http://www.tdii.com/products/AlN_SiCT.html.
Tilak et al., "Influence of Barrier Thickness on the High-Power Performance of AlGaN/GaN HEMTs," *IEEE Electron Device Letters*, 22(11), pp. 504-506 (Nov. 2001).
Walker, J. L. B. (Ed.), *High Power GaAs FET Amplifiers*, Norwood, MA: Artech House, pp. 119-120 (1993).
Wu et al., "3.5-Watt AlGaN/GaN HEMTs and Amplifiers at 35 GHz," IEDM-2003, Cree, Inc.
Wu et al., "3.5-Watt AlGaN/GaN HEMTs and Amplifiers at 35 GHz," Cree Santa Barbara Technology Center, Goleta, CA 93117.
Wu et al., "30-W/mm GaN HEMTs by Field Plate Optimization," *IEEE Electron Device Letters*, 25(3), pp. 117-119 (Mar. 2004).
Wu et al., "Bias-dependent Performance of High-Power AlGaN/GaN HEMTs," *IEDM Technical Digest*, p. 378-380 (2001).
Wu et al., "Linearity Performance of GaN HEMTs With Field Plates," DRC 2004, Cree, Inc.
Wu et al., "Linearity Performance of GaN HEMTs With Field Plates," Cree Santa Barbara Technology Center, Goleta, CA 93117.
Yu et al., "Schottky Barrier Engineering in III-V Nitrides via the Piezoelectric Effect," *Applied Physics Letters*, 73(13), pp. 1880-1882 (Sep. 28, 1998).
Zhang et al., "High Breakdown GaN HEMT with Overlapping Gate Structure," *IEEE Electron Device Letters*, 21(9), pp. 421-423 (Sep. 2000).
Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).
Ben-Yaacov et al., "AlGaN/GaN Current Aperture Vertical Electron Transistors with Regrown Channels," *Journal of Applied Physics*. vol. 95, No. 4, pp. 2073-2078 (2004).
Burm et al. "Ultra-Low Resistive Ohmic Contacts on n-GaN Using Si Implantation," *Applied Physics Letters*. vol. 70, No. 4, 464-66 (1997).
Heikman, et al., "Mass Transport Regrowth of GaN for Ohmic Contacts to AlGaN/GaN," *Applied Physics Letters*. vol. 78, No. 19, pp. 2876.
Shen et al., "High-Power Polarization-Engineered GaN/AlGaN/GaN HEMTs Without Surface Passivation," *IEEE Electronics Device Letters*. vol. 25, No. 1, pp. 7-9 (2004).
Asbeck et al. "Piezoelectric charge densities in AlGaN/GaN HFETs," *Elecronics Letters*. vol. 33, No. 14, pp. 1230-1231 (1997).
Breitschadel et al. "Minimization of Leakage Current of Recessed Gate AlGaN/GaN HEMTs by Optimizing the Dry-Etching Process," *Journal of Electronic Materials*. vol. 28, No. 12, pp. 1420-1423 (1999).
Burm et al. "Recessed Gate GaN MODFETS," *Solid-State Electronics*. vol. 41, No. 2, pp. 247-250 (1997).
Chen et al. "Cl2 reactive ion etching for gate recessing of AlGaN/GaN field-effect transistors," *J. Vac. Sci. Technol. B*. vol. 17, No. 6, pp. 2755-2758 (1999).
Eastman et al. "GaN materials for high power microwave amplifiers," *Mat. Res. Soc. Symp. Proc.* vol. 512 (1998).
Eastman et al. "Undoped AlGaN/GaN HEMTs for Microwave Power Amplification," *IEEE Transactions on Electron Devices*. vol. 48, No. 3, pp. 479-485 (Mar. 2001).
Egawa et al. "Recessed gate AlGaN/GaN MODFET on Sapphire Grown by MOCVD," *Applied Physics Letters*. vol. 76, No. 1, pp. 121-123 (Jan. 2000).
Gaska et al. "High-Temperature Performance of AlGaN/GaN HFETs on SiC Substrates," *IEEE Electron Device Letters*. vol. 18, No. 10, pp. 492-494 (Oct. 1997).

Gaska et al. "Electron Transport in AlGaN/GaN Heterostructures Grown on 6H-SiC Substrates," *Applied Physics Letters*. vol. 72, No. 6, pp. 707-709 (Feb. 1998).
Gelmont et al. "Monte Carlo simulation of electron transport in gallium nitride," *Journal of Applied Physics*. vol. 74, No. 3, pp. 1818-1821 (Aug. 1993).
Heikman et al. "Polarization Effects in AlGaN/GaN and GaN/AlGaN/GaN heterostructures," *Journal of Applied Physics*. vol. 93, No. 12, pp. 10114-10118 (Jun. 2003).
Heikman et al., "Growth of Fe-Doped Semi-insulating GaN by Metalorganic Chemical Vapor Deposition," *Applied Physics Letters*. vol. 83, No. 1, pp. 439-441 (Jul. 2002).
Heikman, Sten J., *MOCVD Growth Technologies for Applications in AlGaN/GaN High Electron Mobility Transistors*, Dissertation, University of California—Santa Barbara, Sep. 2002, 190 pages.
Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).
Karmalkar et al. "RESURF AlGaN/GaN HEMT for High Voltage Power Switching," *IEEE Electron Device Letters*. vol. 22, No. 8, pp. 373-375 (Aug. 2001).
Kuzmik et al. "Annealing of Schottky contacts deposited on dry etched AlGaN/Gan," *Semiconductor Science and Technology*. vol. 17, No. 11 (Nov. 2002).
Neuburger et al. "Design of GaN-based Field Effect Transistor Structures based on Doping Screening of Polarization Fields," WA 1.5, 7th Wide-Bandgap III-Nitride Workshop (Mar. 2002).
Ping et al. "DC and Microwave Performance of High-Current AlGaN/GaN Heterostructure Field Effect Transistors Grown on p-Type SiC Substrates," *IEEE Electron Device Letters*. vol. 19, No. 2, pp. 54-56 (Feb. 1998).
Sriram et al. "RF Performance of AlGaN/GaN MODFETs on High Resistivity SiC Substrates," Presentation at Materials Research Society Fall Symposium, 1997.
Sriram et al. "SiC and GaN Wide Bandgap Microwave Power Transistors," *IEEE Samoff Symposium*, Pittsburgh, PA, Mar. 18, 1998.
Sullivan et al. "High-Power 10-GHz Operation of AlGaN HFET's on Insulating SiC," *IEEE Electron Device Letters*. vol. 19, No. 6, pp. 198-200 (Jun. 1998).
Wu et al. "High Al-Content AlGaN/GaN MODFET's for Ultrahigh Performance," *IEEE Electron Device Letters*. vol. 19, No. 2, pp. 50-53 (Feb. 1998).
Dang et al. "Influence of surface processing and passivation on carrier concentrations and transport properties in AlGaN/GaN heterostructures", *J. Appl. Phys.* 90(3):1357-1361 (2001).
Khan et al. "AlGaN/GaN Metal Oxide Semiconductor Heterostructure Field Effect Transistor", *IEEE Electron Device Letters* 21(2):63-65 (2000).
Simin et al. "SiO$_2$/AlGaN/InGaN/GaN MOSDHFETs", *IEEE Electron Device Letters* 23(8):458-460 (2002).
Yoshida et al. "Improvement of Endurance to Hot Carrier Degradation by Hydrogen Blocking P-SIO", *IEDM* 88:22-25 (IEEE 1988).
Hu et al. "Si$_3$N$_4$/AlGaN/GaN-metal-insulator-semiconductor heterostructure field-effect transistor", *Applied Physics Letters*, Am. Institute of Physics 79(17):2832-2834 (2001).
Khan et al. "AlGaN/GaN-metal-insulator-semiconductor heterostructure field-effect transistors on SiC substrates", *Applied Physics Letters*, Am. Institute of Physics 77(9):1339-1341 (2000).
Dorf "The Electrical Engineering Handbook 2d Edition" *CRC Press* p. 994 (1997).
Lu et al. "P-Type SiGe Transistors with Low Gate Leakage Using SiN Gate Dielectric", *IEEE Electron Device Letters*, IEEE, Inc. 20(10):514-516 (1999).
Zhang et al. "High Breakdown GaN HEMT with Overlapping Gate Structure", *IEEE Electron Device Letters*, IEEE, Inc. 21(9):373-375 (2000).
Tilak et al. "Effect of Passivation on AlGaN/GaN HEMT Device", *IEEE* pp. 357-363 (2000).
Saito et al. "High Breakdown Voltage AlGaN-Gan Power-HEMT Design and High Current Density Switching Behavior", *IEEE Transactions on Electron Devices* 50(12):2528-2531 (2003).

(56) References Cited

OTHER PUBLICATIONS

Micovic et al. "AlGaN/GaN Heterojunction Field Effect Transistors Grown by Nitrogen Plasma Assisted Molecular Beam Epitaxy", *IEEE Transactions on Electron Devices* 48(3):591-596 (2001).

Karmalkar et al. "Very high voltage AlGaN/GaN high electron mobility transistors using a field plate deposited on a stepped insulator", *Solid State Electronics* 45:1645-1652 (2001).

Saito et al. "600V AlGaN/GaN Power-HEMT: Design, Fabrication and Demonstration on High Voltage DC-DC Converter", *IEEE IEDM* 23(7):587-590 (2003).

Wu et al. "High-gain Microwave Gan HEMTs with Source-terminated Field-plates", Cree Santa Barbara Technology Center 2 pages.

Wu et al. "Very-High Power Density AlGaN/GaN HEMTS", *IEEE Transactions on Electron Devices* 48(3):586-590 (2001).

Saito et al. "Design and Demonstration of High Breakdown Voltage GaN High Transistor (HEMT) using Field Plate Structure for Power Electronics Applications", *Japanese J. of Applied Phys.* 43(4B):2239-2242 (2004).

Li et al. "High Breakdown Voltage GaN HFET with Field Plate", *Electronics Letters* 37(3):196-197 (2001).

Xing et al. "High Breakdown Voltage AlGaN-GaN HEMTs Achieved by Multiple Field Plates", *IEEE Electron Device Letters* 25(4):161-163 (2004).

Mok et al. "A Novel High-Voltage High-Speed MESFET Using a Standard GaAs Digital IC Process", *IEEE Transactions on Electron Devices* 41(2):246-250 (1994).

Saito et al. "Theoretical Limit Estimation of Lateral Wide Band-Gap Semiconductor Power-Switching Device", *Solid State Electronics* 48:1555-1562 (2003).

Lu et al. "AlGaN/GaN HEMTs on SiC with over 100 GHz fT and Low Microwave Noise", *IEEE Transactions on Electron Devices* 48(3):581-585 (2001).

Asano et al. "Novel High Power AlGaAs/GaAs HFET with a Field-Modulating Plate Operated at 35V Drain Voltage", *IEEE IEDM* 98:59-62 (1998).

Wu et al. "High Al Content AlGaN/GaN HEMTs With Very High Performance", *IEDM* pp. 925-927 (1999).

Wakejima et al. "High Power Density and Low Distortion INGAP Channel FETs with Field-Modulating Plate", *IEICE Transactions on Electronics* E85-C(12):2041-2045 (2002).

Wu et al. "GaN-Based FETs for Microwave Power Amplification", *IEICE Transactions on Electronics* E85-C:1895-1905 (1999).

S. Denbaars et al., "Ion Implanted AlGaN HEMTs With Nonalloyed Ohmic Contacts", IEEE Electron Device Letters, 26:5, pp. 283-285 (May 2005); XP011131276.

Y. Saito et al., "Effect of Silicon Nitride Cap on the Activation of Implanted Silicon in Gallium Arsenide", Japanese Journal of Applied Physics, 42:8.1, pp. 4924-4927 (Aug. 2003); XP001191418.

T. Enoki et al., "Characteristics Including Electron Velocity Overshoot for 0.1-µm-Gate-Length GaAs SAINT MESFET's", IEEE Transactions on Electron Devices, 37:4, pp. 935-941 (Apr. 1990); XP000125204.

International Search Report and Written Opinion (15 pages) corresponding to International Application No. PCT/US2007/023095; Mailing Date: Nov. 10, 2008.

Japanese Office Action Corresponding to Japanese Patent Application No. 2009-536251; Date of Mailing: Aug. 24, 2012; English Translation, 4 Pages.

\* cited by examiner

SEMICONDUCTOR DEVICES INCLUDING IMPLANTED REGIONS FOR PROVIDING LOW-RESISTANCE CONTACT TO BURIED LAYERS AND RELATED DEVICES

FIELD OF THE INVENTION

The present invention relates to semiconductor devices, and more particularly, to semiconductor devices including implanted regions and related methods of fabrication.

BACKGROUND OF THE INVENTION

There is a high level of interest in wide bandgap semiconductor materials such as silicon carbide (2.996 eV for alpha SiC at room temperature) and the Group III nitrides (e.g., 3.36 eV for GaN at room temperature) for high power, high temperature and/or high frequency applications. These materials, typically, have higher electric field breakdown strengths and higher electron saturation velocities as compared to gallium arsenide and silicon.

In order to provide desired properties in semiconductor materials, it is frequently desirable to dope a semiconductor layer with impurity atoms (i.e., dopants). Doping of semiconductor materials may be performed during and/or after material growth. Impurity atoms may be categorized as n-type or p-type depending on whether the implanted ions act as donors (which increase the number of electrons) or acceptors (which increase the number of holes), respectively, in the doped material. The resulting material may be characterized as n-type or p-type depending on the predominant type of dopants in the material.

Ion implantation is a well-known method of doping a semiconductor layer with impurities. In an ion implantation process, ionized impurity atoms are accelerated under high vacuum through an electric field towards a target layer, where they become implanted. The number of ions directed at a target layer is referred to as the dose, which is typically expressed in ions/cm$^2$. The ions are accelerated at an energy level, typically expressed in electron-volts (eV). The distribution of ions in the implanted layer depends on the dose and energy of the implant, sometimes referred to as the implant conditions, as well as the type of ions implanted, the type of material the ions are implanted into, the angle of the implants, and other factors. The implanted ions typically form a concentration distribution that has a peak concentration at a particular depth (i.e., the "implant range").

Ion implantation may be useful for selective doping of crystalline material in order to form desired regions in the material, such as p-n junctions, highly conductive contact regions, field spreading regions, etc. Typically, after impurities are implanted into a semiconductor layer, it may be desirable to anneal the implanted impurities at a high temperature, i.e., a so-called activation anneal. An activation anneal may repair damage caused by the implantation of high-energy ions into the semiconductor lattice. Implant damage may include, for example, broken and/or rearranged chemical bonds within the semiconductor lattice. The activation anneal may also assist implanted impurity ions in finding a suitable site in the crystal lattice at which the ions may appropriately act as acceptors and/or donors. However, for some semiconductor materials, the temperature at which appreciable lattice damage repair may occur may be above the temperature at which the material will dissociate at normal ambient pressures. As such, it is known to provide a stable capping layer on an implanted semiconductor layer during the activation anneal. The material of the capping layer may be stable at high temperatures, and may not react with the underlying implanted semiconductor layer.

SUMMARY OF THE INVENTION

According to some embodiments of the present invention, a method of fabricating a semiconductor device includes forming a first semiconductor layer of a first conductivity type and having a first dopant concentration, and forming a second semiconductor layer on the first semiconductor layer. The second semiconductor layer has a second dopant concentration that is less than the first dopant concentration. Ions are implanted into the second semiconductor layer to form an implanted region of the first conductivity type extending through the second semiconductor layer to contact the first semiconductor layer. A first electrode is formed on the implanted region of the second semiconductor layer, and a second electrode is formed on a non-implanted region of the second semiconductor layer that is spaced apart from the implanted region.

In some embodiments, the first semiconductor layer and the second semiconductor layer may be a Group III-nitride material. The first and second semiconductor layers may be formed on a silicon carbide (SiC) substrate. In addition, the implanted ions may be silicon (Si), sulfur (S) and/or oxygen (O) ions.

In other embodiments, a protective layer may be formed on the second semiconductor layer prior to implanting the ions. The ions may thereby be implanted into the second semiconductor layer through the protective layer. After implanting the ions, the first and second semiconductor layers and the protective layer may be annealed to activate the implanted ions. In some embodiments, the protective layer may be silicon nitride (SiN), silicon dioxide (SiO$_2$), and/or silicon oxynitride (SiON). In other embodiments, the protective layer may be a high purity nitride (HPN) layer.

In some embodiments, in forming the first electrode, an opening may be formed in the protective layer after annealing to expose the implanted region of the second semiconductor layer. An ohmic contact may be formed in the opening on the exposed implanted region. In addition, a second opening in may be formed in the protective layer to expose a non-implanted region of the second semiconductor layer, and the second electrode may be formed in the second opening.

In other embodiments, the first and second semiconductor layers may be gallium nitride (GaN). A first protective layer may be formed on the second semiconductor layer, and a second protective layer may be formed on the first protective layer. The first protective layer may be a Group III-nitride including aluminum, and the second protective layer may be a high purity nitride (HPN).

In some embodiments, the ions may be implanted into the second semiconductor layer to form the implanted region extending through the second semiconductor layer and at least partially into the protective layer and/or the first semiconductor layer. Accordingly, the distribution of implanted dopants may extend at least partially into the protective layer and/or at least partially into the first semiconductor layer. The implanted region may have a peak dopant concentration in the second semiconductor layer. For example, the implanted region may have a peak dopant concentration of about 5×10$^{20}$ ions/cm$^3$.

In other embodiments, the ions may be implanted into the second semiconductor layer to provide a distribution of implanted dopants having a substantially uniform concentration throughout the implanted region. For example, depending on a thickness of the second semiconductor layer and/or other layers, a plurality of doses and/or implantation energies may be selected to provide the substantially uniform concentration.

In some embodiments, to provide a distribution of implanted dopants having a substantially uniform concentration, ions of the first conductivity type may be implanted into the second semiconductor layer at a first dose and at a first implantation energy, and then ions of the first conductivity type may be implanted into the second semiconductor layer at a second dose and at a second implantation energy. For example, the first dose may be about $0.5 \times 10^{15}$ to about $2.5 \times 10^{15}$ ions/cm$^2$, and the first implantation energy may be about 160 keV. Also, the second dose may be about $0.8 \times 10^{15}$ to about $5 \times 10^{15}$ ions/cm$^2$, and the second implantation energy may be about 260 keV. In addition, in some embodiments, the ions of the first conductivity type may be further implanted into the second semiconductor layer at a third dose and at a third implantation energy. For instance, the third dose may be about $0.5 \times 10^{15}$ to about $3.7 \times 10^{15}$ ions/cm$^2$, and the third implantation energy may be about 360 keV.

In other embodiments, the first semiconductor layer and the second semiconductor layer may be a same material. In some embodiments, the second semiconductor layer may be an undoped layer. In other embodiments, the second semiconductor layer may have a same and/or opposite conductivity type as the first semiconductor layer.

In some embodiments, the first semiconductor layer and/or the second semiconductor layers may be an epitaxial layer. For example, the first semiconductor layer may be epitaxially grown to have the first dopant concentration on a substrate. Also, the second semiconductor layer may be epitaxially grown to have the second dopant concentration on the first semiconductor layer.

In other embodiments, the first electrode may be an ohmic contact. In addition, in some embodiments, a lateral distance between the second electrode and the implanted region may be less than a lateral distance between the second electrode and the first electrode. For example, the lateral distance between the second electrode and the implanted region may be less than about 1 micron (µm).

In some embodiments, the first electrode may be a cathode contact formed on the implanted region of the second semiconductor layer. Also, the second electrode may be an anode contact formed on the non-implanted region of the second semiconductor layer spaced apart from the implanted region. In some embodiments, the first semiconductor layer and/or the second semiconductor layer may have a thickness of about 100 nm to about 500 nm.

In other embodiments, the first electrode may be a source/drain contact formed on the implanted region of the second semiconductor layer. Also, the second electrode may be a gate contact formed on the non-implanted region of the second semiconductor layer spaced apart from the implanted region. In some embodiments, the gate contact and the source/drain contact may be formed in a same metallization process. Also, in some embodiments, a bandgap of the second semiconductor layer may be greater than a bandgap of the first semiconductor layer.

According to other embodiments of the present invention, a semiconductor device includes a first semiconductor layer of a first conductivity type and having a first dopant concentration, a second semiconductor layer on the first semiconductor layer and having a second dopant concentration that is less than the first dopant concentration, an implanted region in the second semiconductor layer including a distribution of implanted dopants of the first conductivity type extending through the second semiconductor layer to contact the first semiconductor layer, a first electrode on the implanted region of the second semiconductor layer, and a second electrode on a non-implanted region of the second semiconductor layer that is spaced apart from the implanted region.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1A:
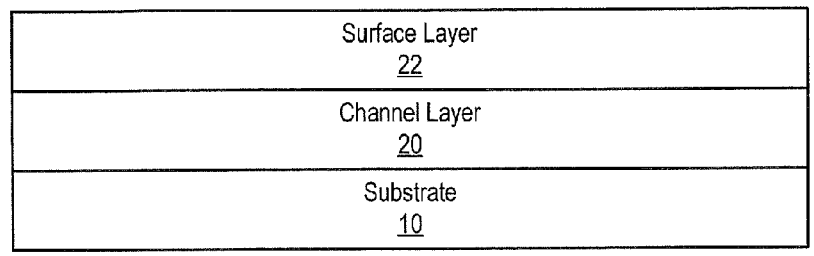
FIGS. 1A-1F are cross-sectional views illustrating fabrication of semiconductor devices according to embodiments of the present invention.

Embodiments of the present invention now will be described more fully hereinafter with reference to the accompanying figures, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will also be appreciated by those of skill in the art that references to a structure or feature that is disposed "adjacent" another feature may have portions that overlap or underlie the adjacent feature.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "below" and "upper" or "above" may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Some embodiments of the present invention may be particularly well suited for use in Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Some embodiments of the present invention provide methods for forming implanted regions that extend through a lower-conductivity semiconductor layer to facilitate ohmic contact to a buried higher-conductivity semiconductor layer. More particularly, ions are implanted into the lower-conductivity semiconductor layer to form the implanted region extending through the lower-conductivity semiconductor layer to contact the higher-conductivity semiconductor layer.

Structures that may utilize implanted regions according to some embodiments of the present invention may include a conductive channel layer that is buried under a higher-bandgap barrier layer, such as high electron mobility transistors (HEMTs). Suitable structures for GaN-based HEMTs that may utilize embodiments of the present invention are described, for example, in commonly assigned U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME", U.S. Provisional Application Ser. No. 60/290,195 filed May 11, 2001 for "GROUP III NITRIDE BASED HIGH ELECTRON MOBILITY TRANSISTOR (HEMT) WITH BARRIER/SPACER LAYER", United States Patent Publication No. 2002/0167023A1 to Smorchkova et al., published Nov. 14, 2002, entitled "GROUP-III NITRIDE BASED HIGH ELECTRON MOBILITY TRANSISTOR (HEMT) WITH BARRIER/SPACER LAYER", U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES", and U.S. patent application Ser. No. 11/302,062 filed Dec. 13, 2005 for "SEMICONDUCTOR DEVICES INCLUDING IMPLANTED REGIONS AND PROTECTIVE LAYERS AND METHODS OF FORMING THE SAME", the disclosures of which are hereby incorporated herein by reference in their entirety.

A particular structure that may utilize implanted regions according to some embodiments of the present invention may include a highly conductive layer that is buried under a less conductive and/or insulating layer. For example, a n+/n− metal-semiconductor (M-S) diode may include an undoped or low-doped n− layer on top of a highly conductive n+ layer. The n− layer may provide good Schottky behavior, and may provide a predetermined distance between the anode and the highly conductive n+ layer. However, providing a cathode contact to the highly conductive buried n+ layer may require recessing through the n− layer, which may be difficult and/or non-repeatable when both the n− and n+ layers are formed of a same material. Accordingly, in some embodiments of the present invention, ions are implanted into the n− layer to form an implanted region extending through the n− layer to provide ohmic contact to the highly conductive buried n+ layer.

Fabrication of structures according to some embodiments of the present invention is schematically illustrated in FIGS. 1A-1F. As seen in FIG. 1A, a substrate 10 is provided on which nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used in a relative rather than absolute sense. In particular embodiments of the present invention, the silicon carbide bulk crystal has a resistivity equal to or higher than about $1\times10^5$ Ω-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device. Additionally, strain balancing transition layer(s) may also be provided as described, for example, in commonly assigned United States Patent Publication 2003/0102482A1 entitled "STRAIN BALANCED NITRIDE HETROJUNCTION TRANSISTORS AND METHODS OF FABRICATING STRAIN BALANCED NITRIDE HETEROJUNCTION TRANSISTORS, and U.S. Provisional Patent Application Ser. No. 60/337,687, filed Dec. 3, 2001 and entitled "STRAIN BALANCED NITRIDE HETEROJUNCTION TRANSISTOR," the disclosures of which are incorporated herein by reference as if set forth fully herein.

Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present invention, and methods for producing are described, for example, in U.S. Pat. Nos. Re. 34,861; 4,946,547; 5,200,022; and 6,218,680, the disclosures of which are incorporated herein by reference in their entirety. Similarly, techniques for epitaxial growth of Group III nitrides have been described in, for example, U.S. Pat. Nos. 5,210,051; 5,393,993; 5,523,589; and 5,292,501, the disclosures of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed. Furthermore, in some embodiments, the substrate may be removed after epitaxial growth, and the epitaxial layers may be bonded to a carrier substrate.

Returning to FIG. 1A, a relatively high-conductivity semiconductor layer is formed on the substrate 10, for example, as a channel layer 20. The channel layer 20 may be epitaxially grown on the substrate 10 to have a desired conductivity type and/or dopant concentration. For example, in some embodiments, the channel layer 20 may be an n-type layer having a dopant concentration of about $1\times10^{19}$ ions/cm$^3$. The channel layer 20 may also be deposited on the substrate 10 using buffer layers, transition layers, and/or nucleation layers as described above. The channel layer 20 and/or buffer nucleation and/or transition layers may be deposited by MOCVD or by other techniques known to those of skill in the art, such as MBE or HVPE. In some embodiments of the present invention, the channel layer 20 is a Group III-nitride layer, such as $Al_xGa_{1-x}N$ where $0 \le x < 1$. In certain embodiments of the present invention, x=0, indicating that the channel layer 20 is GaN. The channel layer 20 may also be other Group III-nitrides layers, such as InGaN, AlInGaN, or the like.

Still referring to FIG. 1A, a lower-conductivity semiconductor layer, referred to hereinafter as a surface layer 22, is formed on the channel layer 20. The surface layer 22 has a dopant concentration that is less than the dopant concentration of the channel layer 20. The surface layer 22 may be epitaxially grown on the channel layer 20 to have a desired conductivity type and/or dopant concentration. For example, the surface layer 22 may be an undoped ("unintentionally doped") layer, and/or may have the same and/or opposite conductivity type as the channel layer 20. In some embodiments of the present invention, the surface layer 22 is also a Group III-nitride layer, such as $Al_xGa_{1-x}N$ where $0 \le x < 1$. The surface layer 22 may also be other Group III-nitrides layers, such as InGaN, AlInGaN, or the like. In addition, the channel layer 20 and the surface layer 22 may be formed of the same material.

Accordingly, in some embodiments of the present invention, the channel layer 20 and the surface layer 22 may provide a highly-conductive layer buried under a less-conductive and/or insulating layer, for example, for use in a metal-semiconductor or Schottky diode. For example, the channel layer 20 may be a highly-doped n-type GaN layer with a dopant concentration of about $1\times10^{19}$ ions/cm$^3$ or higher, and the surface layer 22 may be a low-doped or undoped n-type GaN layer with a dopant concentration of less than about $1\times10^{19}$ ions/cm$^3$. The channel layer 20 and/or the surface layer 22 may be formed to a thickness of about 100 nm to about 500 nm. Accordingly, the surface layer 22 may provide a controllable Schottky contact for an electrode 32 to be formed in a subsequent process.

Figure 1B:
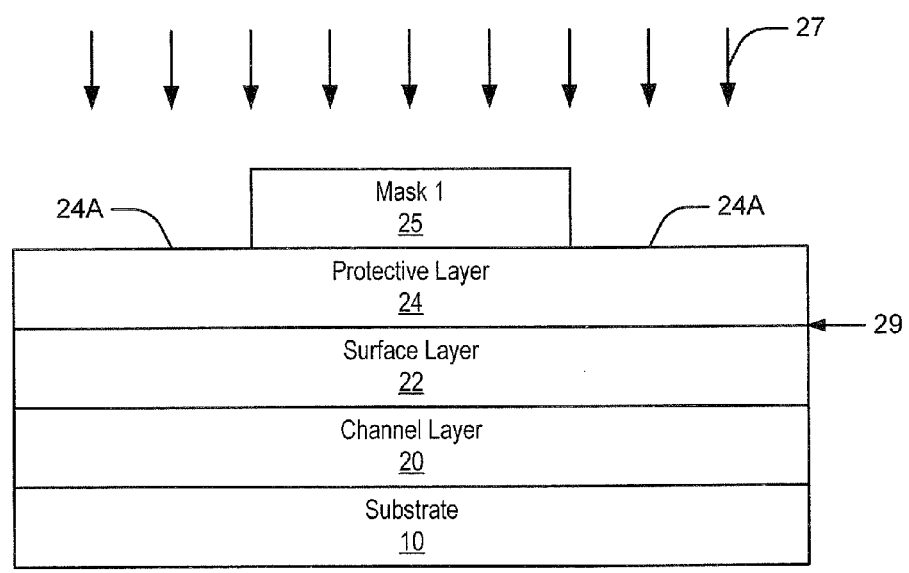

In other embodiments of the present invention, the channel layer 20 and the surface layer 22 may be selected to provide a heterojunction at the interface between the channel and surface layers, for example, for use in a HEMT device. As such, the channel layer 20 may have a bandgap that is less than the bandgap of the surface layer 22, which may correspond to the barrier layer in a HEMT device. The channel layer 20 may also have a larger electron affinity than the surface layer 22. The channel layer 20 may include a multi-layer structure, such as a superlattice and/or combinations of GaN, AlGaN, or the like. The surface layer 22 may include AlGaN, AlInGaN and/or AlN or combinations of layers thereof. In some embodiments of the present invention, the aluminum concentration of the surface layer 22 is greater than about 10%. However, in other embodiments of the present invention, the surface layer 22 may include AlGaN with an aluminum concentration of between about 5% and about 100%. The surface layer 22 may be thick enough and may have a high enough Al composition and doping to induce a significant carrier concentration at the interface between the channel layer 20 and the surface layer 22 through polarization effects when the surface layer 22 is buried under ohmic contact metal. Also, the surface layer 22 may be thick enough to reduce or minimize scattering of electrons in the channel due to ionized impurities deposited at the interface between the surface layer 22 and a protective layer 24 (as shown in FIG. 1B). In certain embodiments, the channel layer 20 may be undoped and may be grown to a thickness of greater than about 2 nm. Also, the surface layer 22 may be undoped or doped with an n-type dopant, and may be grown to a thickness of about 0.1 nm to about 10 nm. However, the surface layer 22 should not be so thick as to cause cracking or substantial defect formation therein. HEMT structures suitable for use with some embodiments of the present invention are further described in commonly assigned U.S. patent application Ser. No. 11/302,062 entitled "SEMICONDUCTOR DEVICES INCLUDING IMPLANTED REGIONS AND PROTECTIVE LAYERS AND METHODS OF FORMING THE SAME" filed Dec. 13, 2005, the disclosure of which is incorporated herein by reference as if fully set forth herein.

Referring now to FIG. 1B, a protective layer 24 is formed on the surface layer 22. The protective layer 24 may be silicon nitride ($Si_xN_y$), silicon dioxide ($SiO_2$) and/or another suitable protective material, such as silicon oxynitride (SiON). It will be understood that the terms "$Si_xN_y$," "SiN" and "silicon nitride" are used herein interchangeably to refer to both stoichiometric and non-stoichimetric silicon nitride. Other materials may also be utilized for the protective layer 24. For example, the protective layer 24 could also include magnesium oxide, scandium oxide, aluminum oxide and/or aluminum oxynitride. Furthermore, the protective layer 24 may be a single layer or multiple layers of uniform and/or non-uniform composition. The material of the protective layer 24 may have appropriate interface characteristics, and may be capable of withstanding relatively high temperatures. In addition, in some embodiments, the protective layer 24 may be capable of being removed without significantly damaging the underlying surface layer 22.

In general, the protective layer 24 may be a dielectric layer that has a relatively high breakdown field strength and that provides a relatively low interface trap density at the interface with an underlying Group III-nitride layer, such as the surface layer 22. The protective layer 24 may have a high etch selectivity with respect to the material of the surface layer 22, and may not be reactive to the material of the surface layer 22. Moreover, the protective layer 24 may have a relatively low level of impurities therein. For example, the protective layer 24 may have a relatively low level of hydrogen and other impurities, including oxygen, carbon, fluorine and chlorine. In addition, the protective layer 24 may be stable at relatively high temperatures (e.g. >1000° C.) in order to withstand high annealing temperatures used in subsequent process steps.

In particular embodiments of the present invention, the protective layer 24 is SiN. The SiN may be formed for example by Low Pressure Chemical Vapor Deposition (LPCVD) and/or Metal-Organic Chemical Vapor Deposition (MOCVD). The SiN layer may be stoichiometric (i.e. the ratio of silicon to nitrogen in the material is about 3:4). The stoichiometry of a SiN layer may be adjusted, for example, by adjusting the relative flow rates of $SiH_4$ and $NH_3$ source gases in a CVD process. Moreover, when formed at relatively high temperatures, CVD-grown SiN tends to be stoichiometric.

The stoichiometry of a SiN layer may also affect the index of refraction of the layer. In certain embodiments of the present invention, a SiN protective layer 24 may have an index of refraction at a 633 nm wavelength of from about 1.6 to about 2.2. In particular embodiments, the index of refraction of a SiN protective layer 24 is 1.98±0.05 as measured by ellipsometry. Stoichiometric SiN may also be characterized by its etch rate in a buffered oxide etch (BOE). For example, the etch rate of stoichiometric SiN in BOE is nearly zero (i.e., less than about 1 nanometer/minute).

In some embodiments, the protective layer 24 may be $SiO_2$. The $SiO_2$ may be formed by LPCVD and/or MOCVD and may be stoichiometric. In certain embodiments of the present invention, an $SiO_2$ protective layer may have an index of refraction at a 633 nm wavelength of from about 1.36 to about 1.56. In particular embodiments, the index of refraction of an $SiO_2$ protective layer is 1.46±0.03 as measured by ellipsometry.

When the protective layer 24 includes silicon nitride, the protective layer 24 may have impurity levels at or below the levels shown in Table 1, as measured by secondary ion mass spectroscopy (SIMS) with a Cs ion beam.

TABLE 1

| Element | Concentration ($cm^{-3}$) |
|---|---|
| H | $4 \times 10^{21}$ |
| O | $3 \times 10^{18}$ |
| C | $7 \times 10^{7}$ |
| F | $1 \times 10^{16}$ |
| CL | $4 \times 10^{16}$ |

The protective layer 24 may be blanket formed on the surface layer 22. Typically, the protective layer 24 may have a thickness in the range of about 100 nm, however, other thickness layers may also be utilized. For example, the protective layer 24 should be sufficiently thick so as to protect the underlying layer during a subsequent impurity activation anneal. Layers as thin as two or three monolayers may be sufficient for such purposes. However, in general, the protective layer 24 may have a thickness of from about 10 nm to about 500 nm.

The protective layer 24 may include a high purity nitride (HPN) layer, such as the high purity SiN layer described in U.S. patent application Ser. No. 11/286,805 entitled "GROUP III NITRIDE SEMICONDUCTOR DEVICES WITH SILICON NITRIDE LAYERS AND METHODS OF MANUFACTURING SUCH DEVICES" filed Nov. 23, 2005, the disclosure of which is incorporated herein by reference as if fully set forth herein. In particular, pursuant to certain embodiments of the present invention, an in situ grown SiN protective layer 24 may be grown at relatively high temperatures (e.g., above about 700° C.). In particular embodiments, the SiN layers may be grown at a temperature in the range of about 900-1000° C. Such high temperature growth may also facilitate reducing the impurity levels in the SiN layer and at the interface between a Group III nitride layer and the SiN layer. Additionally, high growth rates may be employed which may facilitate reducing the levels of background reactor impurities incorporated into the SiN layer. For example, in certain embodiments of the present invention, the SiN layer(s) may be grown at a growth rate of at least about 0.2 microns/hour. In certain specific embodiments, the growth rate may be about 2 microns/hour.

Forming the SiN layer in situ may also reduce the levels of impurities that are incorporated into the top surface of the uppermost Group III nitride layer and/or into the SiN layer itself. In particular, when the device is removed from the reactor and the SiN layer is formed via a post-MOCVD growth process such as, for example, sputtering or PECVD, a number of different mechanisms may introduce impurities. For example, as discussed in detail in U.S. Pat. No. 6,498,111, if hydrogen is present in an MOCVD reactor during the growth of a Group III nitride layer, the hydrogen may tend to incorporate into the Group III nitride layer during cooling of the reactor following growth. Likewise, exposure of the device to the atmosphere upon removal from the reactor may allow for incorporation of oxygen atoms, and various other impurities may be introduced, particularly adjacent the outer surfaces of the device, as a result of handling of the device and/or chemical cleaning of the device. Impurities may also be added if post-growth processing such as wet etching, electrode deposition, annealing steps, etc. are performed prior to deposition of the SiN protective/passivation layer. These impurities may change the surface states at the interface between the Group III nitride layer and the SiN layer in ways that may be undesirable and/or difficult to control/reproduce.

For example, the presence of impurities can increase trapping at the interface between the SiN layer and the underlying Group III nitride layer, thereby increasing the sheet resistance of the channel.

In certain embodiments of the present invention, high purity silane ($SiH_4$) may be used as a source gas in the growth of the SiN layer(s). As is known to persons of skill in the art, silane is often used as a source for silicon dopants in the growth of n-doped Group III nitride layers. Typically, diluted silane gas is used in such applications as it is less expensive and easier to use than pure silane, which may be highly combustible. The use of such pure silane may facilitate reducing the level of impurities at, for example, the interface between the Group III nitride layer and the SiN layer and/or within the SiN layer, which may, in certain circumstances, improve the performance and/or reproducibility of the device. In particular, the higher quality (i.e., more pure) SiN layer may help reduce or minimize trapping within the body of the insulative layer, thereby providing a higher breakdown critical field. When such a pure silane gas source is included with the reactor, it may still be desirable to include a diluted silane source as well, so that diluted silane gas may be used as the dopant gas source during the growth of, for example, an n-doped or co-doped Group III nitride layer.

Referring still to FIG. 1B, a mask 25 is formed on the protective layer 24. The mask 25 may include photoresist or any other suitable mask material, such as SiN and/or $SiO_2$. The mask may have a thickness selected to block implanted ions. For example, when the protective layer 24 comprises SiN, the mask 25 may include an oxide such as $SiO_2$, and vice-versa.

Figure 1C:
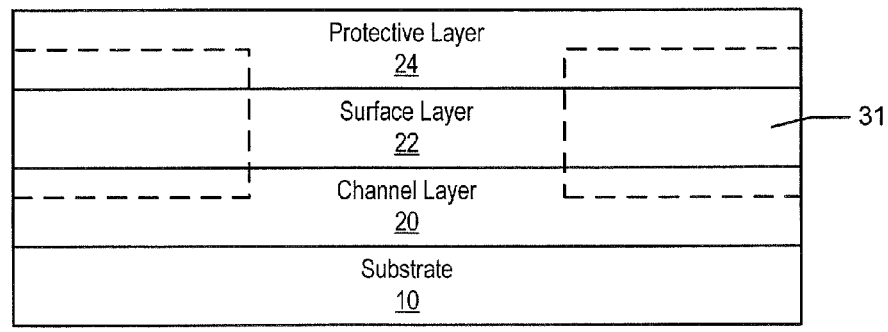

Windows are opened in the mask 25 to expose surface portions 24A of the protective layer 24, and impurity ions 27 are implanted through the windows into the protective layer 24 such that at least a portion of the implanted ions are implanted through the protective layer 24 and come to rest within the surface layer 22. In addition, some of the implanted ions may come to rest within the channel layer 20. The implanted ions may form a distribution profile having a peak dopant concentration in the surface layer 22 between the protective layer 24 and the channel layer 20. However, the implant peak may also be formed away from (i.e., above or below) the interface 29 between the protective layer 24 and the surface layer 22. Accordingly, as shown in FIG. 1C, an implanted region 31 may be formed extending through the surface layer 22 to contact the channel layer 20. In addition, in some embodiments, the implanted region 31 may extend at least partially into the protective layer 24 and/or the channel layer 20.

The implant conditions may be selected to provide an implanted region 31 having a peak dopant concentration of $1 \times 10^{18}$ ions/cm$^3$ or greater. For example, in some embodiments, the dose and energy of the implants may be selected to provide a peak dopant concentration of about $5 \times 10^{20}$ ions/cM$^3$ in the implanted region 31. The implant conditions may also be selected to provide a distribution of implanted dopants having a substantially uniform concentration throughout the implanted region 31 of the surface layer 22. For instance, the implant process may include multiple implant steps to provide a relatively uniform profile of implanted dopants throughout the implanted region 31. As such, the number of implant steps may depend on the thickness of the protection layer 24 and/or the surface layer 22 so that the implanted region 31 may contact the channel layer 20. For example, the implant process may include a first implant step performed under a first set of implant conditions, and a subsequent implant step performed under a second set of implant conditions. However, more than two implant steps may be performed to provide an implanted region 31 having a substantially uniform dopant concentration, as will be discussed below with reference to FIG. 2.

In some embodiments, the implantation may be performed at room temperature. The implant energies and/or doses may be selected to provide an implant profile that achieves a desired sheet resistivity and/or permits fabrication of low resistivity ohmic contacts to the surface layer 22, as discussed below. In order to form n-type implanted regions 31 in a nitride-based layer, the implanted ions 27 may include (Si), sulfur (S), and/or oxygen (O) ions.

After formation of the implanted regions 31, the implants may be activated by an activation anneal. As shown in FIG. 1C, the mask 25 may be removed prior to the implant activation anneal, for example, by means of a photoresist strip and/or an etch process. However, the activation anneal may be performed with the protective layer 24 in place. In particular, the protective layer 24 may protect the surface layer 22 during the anneal. In some embodiments, the protective layer 24 may further remain on the surface layer 22 to act as a passivation layer for the surface layer 22 in the completed device.

The activation anneal may be performed in an inert atmosphere including, for example, $N_2$ and/or Ar. When the protective layer 24 includes SiN, the anneal atmosphere may include a partial pressure of $NH_3$ in the range of about 0.1 mbar to 1000 mbar. More particularly, the $NH_3$ may have a pressure of about 10-100 mbar. In particular, the $NH_3$ may have a pressure of about 90 mbar. The $NH_3$ may help to reduce decomposition of the SiN protective layer 24. The activation anneal may be performed at a temperature sufficient to activate the implanted dopant ions but less than a temperature at which the underlying semiconductor layer, i.e., the surface layer 22, deteriorates. The presence of the protective layer 24 during the high temperature process steps may inhibit damage to the underlying epitaxial layers, including the surface layer 22, that may otherwise result from high temperature annealing. For example, where the surface layer 22 includes AlGaN, the activation anneal may be performed at a temperature greater than 1000° C. In addition, where the surface layer 22 includes GaN, the protective layer 24 may include an AlGaN layer on the surface layer 22 and a HPN layer on the AlGaN layer. Thus, in some embodiments of the present invention, the protective layer 24 may be a multi-layer structure.

In some embodiments, the activation anneal may be performed at a temperature of about 1000° C. to about 1300° C. The activation anneal may be performed in-situ and/or in a separate annealing chamber. The activation anneal may be performed for at least about 30 seconds or more, depending on the anneal temperature. For example, a rapid thermal anneal (RTA) at about 1300° C. may be performed for about 30 seconds, while a furnace anneal at about 1000° C. may be performed for about 30 minutes. The particular selection of activation times and temperatures may vary depending on the type of materials involved and the particular implant conditions employed. In particular embodiments, the anneal time may be in the range of about 30 seconds to about 30 minutes.

Figure 1D:
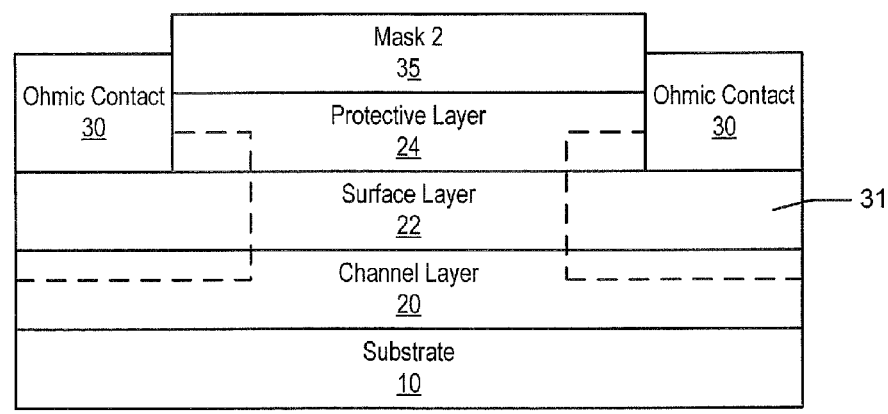

Referring now to FIG. 1D, a second mask 35 is formed on the protective layer, and windows are opened in the protective layer 24 for the formation of electrodes on the implanted regions 31. The windows may be formed utilizing a low damage etch with respect to the surface layer 22 to expose the underlying implanted regions 31 of the surface layer 22. Examples of low damage etch techniques include etching techniques other than reactive ion etching, such as inductively coupled plasma or electron cyclotron resonance (ECR) or downstream plasma etching with no DC component to the plasma. For an SiO₂ protective layer 24, a low damage etch may be a wet etch with buffered hydrofluoric acid. A selective etch of SiN and/or SiO₂ to an etch stop layer, followed by a low damage removal of the etch stop layer may also be performed. For a SiN protective layer 24, SiO₂ may be used as an etch stop layer. In such embodiments, the protective layer 24 may include the SiN and/or SiO₂ layer as well as the etch stop layer. Thus, as mentioned above, the protective layer 24 may include multiple layers.

Figure 1E:
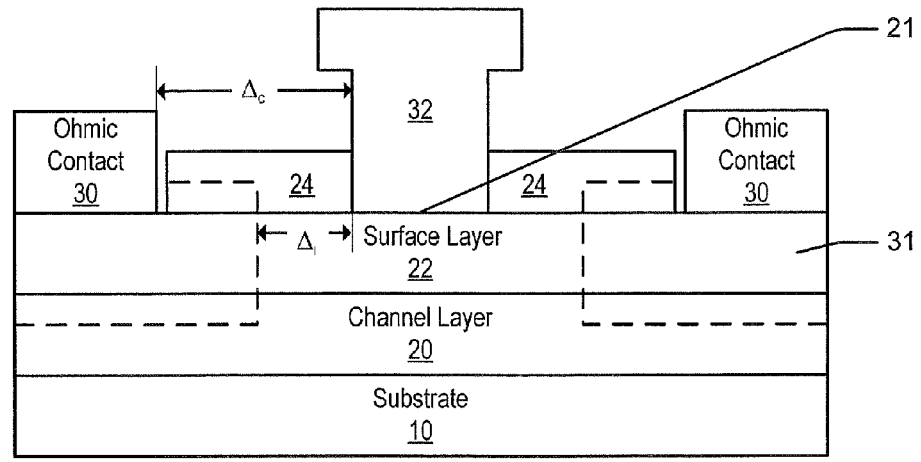

Metal may be deposited on the exposed implanted regions 31 of the surface layer 22, for example by evaporation, to provide the electrodes, which are illustrated in FIG. 1D as ohmic contacts 30. As used herein, the term "ohmic contact" refers to a non-rectifying contact that has a contact resistance of about 1 Ω-mm or less. Suitable metals for the ohmic contacts 30 may include Ti, Si, Ni, Au, Al, Ta, Mo, TiN, WSiN, and/or Pt. If it is desired to anneal the deposited metal to form ohmic contacts, a separate lithography step may be performed such that the ohmic contacts 30 are patterned so as to be smaller than the window in the protective layer 24 (as shown in FIG. 1E). The edges of the ohmic contacts 30 may thereby be spaced apart from the protective layer 24. For example, the edges of the ohmic contacts 30 may be spaced apart from the protective layer 24 by a distance in the range of about 0.1 to about 0.2 µm. The ohmic contacts 30 may be spaced apart from the protective layer 24 by a distance sufficiently large to allow for misalignment tolerances in the formation and patterning of the ohmic contact metal. If the ohmic contact metal contacts the protective layer 24, the metal may diffuse into the protective layer 24 during subsequent heating steps, which may result in a short between a subsequently formed electrode 32 and the ohmic contact(s) 30. The gap between the ohmic contacts 30 and the protective layer 24 should not be so large as to defeat the protective purpose of the protective layer 24 (and thereby substantially degrade the performance of the device), but should not be so small as to risk random contact of ohmic material to the protective layer 24. Thus, for example, in certain embodiments of the present invention, the gap between the edges of the ohmic contacts 30 and the protective layer 24 may be from about 0.1 µm to about 0.5 µm.

In some embodiments, the deposited metal may be annealed at a relatively high temperature to provide the ohmic contacts 30. For example, the anneal may be an anneal at a temperature of greater than about 900° C. in an atmosphere of an inert gas such as N₂ or Ar. Through the use of an ohmic contact anneal, the resistance of the ohmic contacts 30 may be reduced from a relatively high resistance to about 1 Ω-mm or less. As with the implant activation anneal, the presence of the protective layer 24 during the high temperature process steps may inhibit damage to the surface layer 22 that may otherwise be caused by such steps. Thus, for example, the sheet resistance of a region 21 where an electrode 32 may be formed after the high temperature ohmic contact anneal may be substantially the same as the sheet resistance of the region 21 as-grown (i.e., before the contact anneal).

It will be appreciated, however, that due to the presence of the implanted regions 31 in the surface layer 22 as provided above, it may not be necessary to anneal the deposited metal in order to form an ohmic contact thereto. That is, the metal may be ohmic as deposited. Since a contact anneal may not be required, it may be acceptable for the metal of the ohmic contacts 30 to contact the protective layer 24. Thus, in some embodiments of the invention, a lithography step that may otherwise be required in order to ensure that the ohmic contacts 30 are spaced away from the protective layer 24 may be avoided as a result of the implantation of impurities into the surface layer 22.

In addition, since the ohmic contacts 30 are formed on the implanted regions 31, the ohmic contacts 30 may have a lower resistivity than ohmic contacts formed on non-implanted regions. Thus, the on-resistance of devices formed according to some embodiments of the invention may be reduced.

FIG. 1E illustrates the formation of an electrode 32 on a region 21 of the surface layer 22. A mask (not shown) is formed on the ohmic contacts 30 and the protective layer 24, and is patterned to form a window that exposes a portion of the protective layer 24. A recess or opening is then formed through the protective layer 24 to expose a portion 21 of the surface layer 22. The recess is formed using a low damage etch process as described above. In particular embodiments where the ohmic contacts 30 provide source/drain contacts, the recess may be offset between the source and drain contacts such that the recess, and thus the gate contact 32 to be formed in the recess, is closer to the source contact than the drain contact.

As shown in FIG. 1E, the electrode 32 is formed in the recess and contacts the exposed portion 21 of the surface layer 22. For example, where the ohmic contacts 30 are source/drain regions, the electrode 32 may be a "T" gate to provide a HEMT device, and may be fabricated using conventional fabrication techniques. Alternatively, where the ohmic contacts 30 are cathode contacts, the electrode 32 may be an anode contact to provide a Schottky diode. Suitable electrode materials may depend on the composition of the surface layer 22; however, in certain embodiments, conventional materials capable of making a Schottky contact to a nitride based semiconductor material may be used, such as Ni, Pt, NiSi$_x$, Cu, Pd, Cr, W and/or WSiN. Although it may be undesirable, it is possible that a small gap between the protective layer 24 and the electrode 32 may arise as a result of, for example, anisotropy of the low-damage etch, which may result in an exposed portion of the surface layer 22 between the protective layer 24 and the electrode 32.

In some embodiments where the ohmic contacts 30 are cathode contacts, the electrode 32 may be formed as an anode contact on a non-implanted portion of the surface layer 22 such that a lateral distance $\Delta_I$ between the anode contact 32 and the implanted regions 31 of the surface layer 22 is less than a lateral distance $\Delta_C$ between the anode contact 32 and the cathode contacts 30. For example, the lateral distance $\Delta_I$ between the anode contact 32 and the implanted regions 31 may be less than about 1 micron (µm). Accordingly, by providing the implanted regions 31 closer to the anode 32, the series resistance of a metal-semiconductor diode may be reduced. In addition, due to the reduced contact resistance provided by the implanted regions 31, the cathodes 30 may be formed further away from the anode 32 without increasing the series resistance of the diode.

Similarly, where the ohmic contacts 30 are source/drain contacts in a HEMT device, the reduced contact resistance may permit an increase in the drain-source spacing without increasing the on-resistance of the device. This may help improve the performance of power amplifiers at mm-wave frequencies, as well as other applications that require low on-resistance, including, for example, RF power switches, limiters, and cascode cells.

In some embodiments, since the ohmic contacts 30 may not need to be annealed, it may be possible to form the ohmic contacts 30 and the electrode 32 using the same metal in a single metallization step. For example, Ti, Si, Ni, Au, Al, Ta, Mo, TiN, WSiN, and/or Pt may form an ohmic contact asdeposited on the implanted regions 31 of the surface layer 22 while forming a non-ohmic contact 32 on a non-implanted region 21 of the surface layer 22 spaced apart from the implanted regions 31.

Figure 1F:
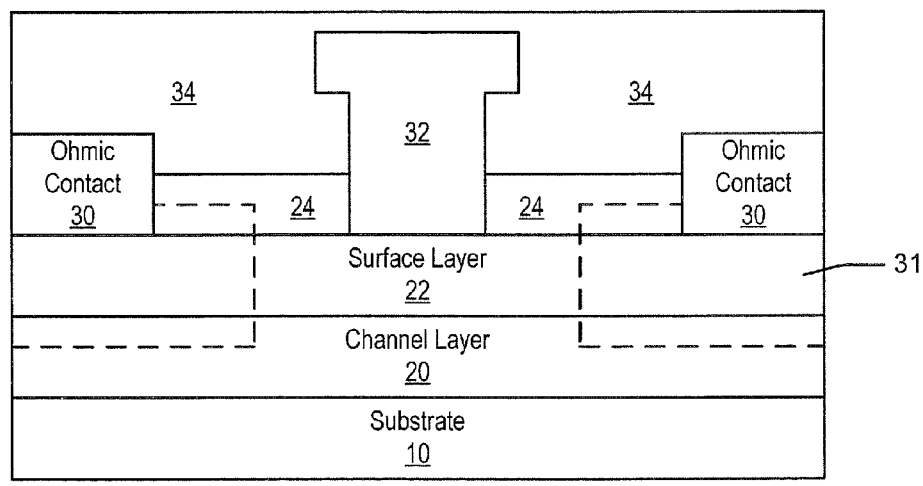

FIG. 1F illustrates the formation of a passivation layer 34. The passivation layer may be blanket deposited on the structure of FIG. 1E. In particular embodiments, the passivation layer 34 is deposited so as to substantially fill a gap between the protective layer 24 and the ohmic contacts 30, and also gaps between the protective layer 24 and the gate contact 32, if such gaps exist. In certain embodiments of the present invention, the passivation layer 34 may be silicon nitride, aluminum nitride, silicon dioxide and/or an oxynitride. Furthermore, the passivation layer 34 may be a single or multiple layers of uniform and/or non-uniform composition.

Figure 2:
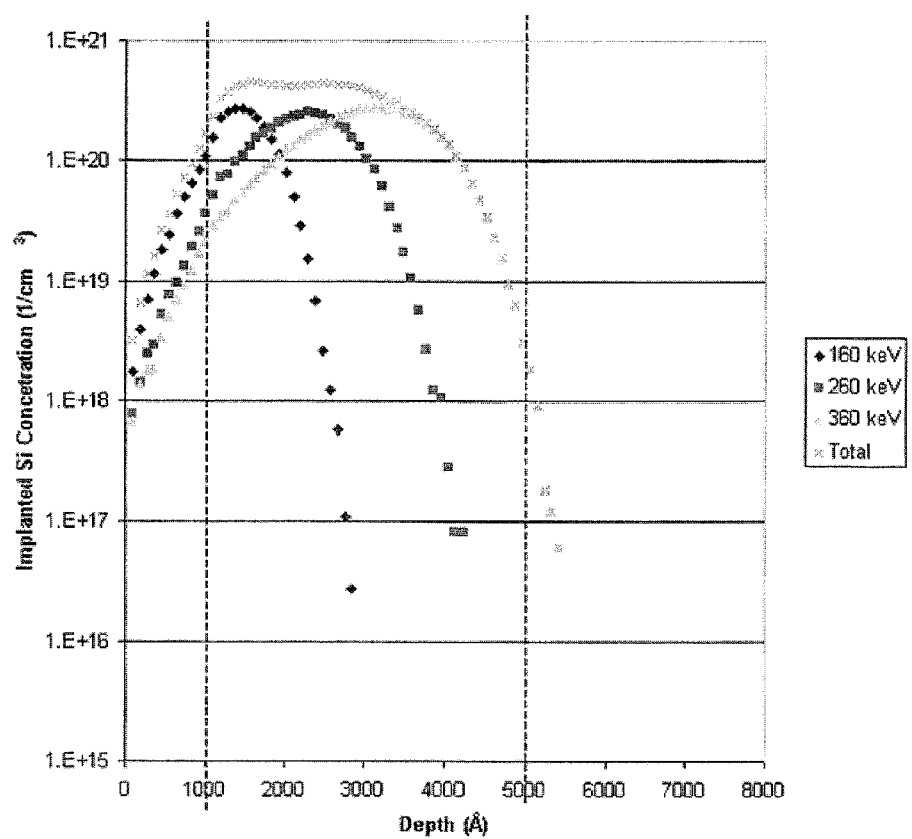
FIG. 2 is a graph illustrating simulation results for the implantation of silicon into gallium nitride structures according to some embodiments of the present invention.

FIG. 2 is a graph illustrating simulation results for a possible impurity profile of silicon ions implanted into a structure including a HPN protective layer on a n− GaN surface layer and a n+ GaN channel layer. As shown in the simulation results of FIG. 2, silicon ions were implanted into the structure in three implant steps under differing sets of implant conditions to provide a substantially uniform dopant concentration. More particularly, the simulation results illustrate silicon ions implanted in the first implant step at a dose of about $0.5 \times 10^{15}$ to about $2.5 \times 10^{15}$ ions/cm$^2$ and at an implantation energy of about 160 keV, in the second implant step at a dose of about $0.8 \times 10^{15}$ to about $5 \times 10^{15}$ ions/cm$^2$ and at an implantation energy of about 260 keV, and in the third implant step at a dose of about $0.5 \times 10^{15}$ to about $3.7 \times 10^{15}$ ions/cm$^2$ and at an implantation energy of about 360 keV. According to the simulation results, the three-step implant process described above may result in an implanted region having a substantially uniform dopant concentration with a peak concentration of about $5 \times 10^{20}$ ions/cm$^3$, which may be desirable for some applications. However, the number of implant steps may depend on the thickness of the protective layer and/or the surface layer, in order to provide the implanted region in contact with the channel layer. As such, the combinations of energy, dose, and/or other implant conditions may be optimized for a given structure, and are not limited to those combinations described herein.

While embodiments of the present invention have been described herein with reference to particular diode and HEMT structures, the present invention should not be construed as limited to such structures. For example, additional layers may be included in a HEMT device while still benefiting from the teachings of the present invention. Such additional layers may include GaN cap layers, as for example, described in Yu et al., "Schottky barrier engineering in III-V nitrides via the piezoelectric effect," Applied Physics Letters, Vol. 73, No. 13, 1998, or in U.S. Patent Publication No. 2002/0066908A1 for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein. In some embodiments, insulating layers such as SiN, or relatively high quality AlN may be deposited for making a MISHEMT and/or passivating the surface. The additional layers may also include a compositionally graded transition layer or layers.

Furthermore, the surface layer 22 may also be provided with multiple layers as described in United States Patent Publication No. 2002/0167023A1, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. Thus, embodiments of the present invention should not be construed as limiting the surface/barrier layer to a single layer but may include, for example, insulating layers having combinations of GaN, AlGaN and/or AlN layers. For example, a GaN, AlN structure may be utilized to reduce or prevent alloy scattering. Thus, embodiments of the present invention may include nitride based surface layers, such as AlGaN-based barrier layers, AlN-based barrier layers, and/or combinations thereof.

Although described herein primarily with reference to lateral Schottky diode and HEMT structures, embodiments of the present invention may also be employed in connection with other types of devices and/or materials. For example, embodiments of the invention may be particularly suited for use in silicon carbide MESFET devices, such as the devices described in U.S. Pat. No. 6,686,616 entitled "SILICON CARBIDE METAL-SEMICONDUCTOR FIELD EFFECT TRANSISTORS" the disclosure of which is hereby incorporated herein by reference in their entirety. Likewise, some embodiments of the invention may be advantageously employed in GaN-based light emitting devices (LEDs), GaAs-based devices such as GaAs/AlGaAs pHEMT devices, GaN JFET devices, GaN HJFET devices, heterojunction bipolar transistors (HBTs) including an implanted base contact through the emitter, and/or other opto-electronic or electronic Group III-nitride devices where preservation of as-grown surface properties may be desired.

In the drawings and specification, there have been disclosed typical embodiments of the invention, and, although specific terms have been employed, they have been used in a generic and descriptive sense only and not for purposes of limitation.

That which is claimed is:

1. A semiconductor device, comprising:
a channel layer of a first conductivity type;
a surface layer on the channel layer;
a protective layer on the surface layer;
an implanted region including a distribution of implanted dopants of the first conductivity type extending into the surface layer and the channel layer and within a portion of the protective layer, wherein a portion of the channel layer into which the implanted region extends has a higher conductivity than the surface layer,
wherein the distribution of implanted dopants has an implanted dopant concentration of at least about $5 \times 10^{20}$ ions/cm$^3$ at a depth within the implanted region of at least about 1500 Angstroms,
wherein the distribution of implanted dopants has a substantially uniform concentration throughout the implanted region in the surface layer, and
wherein the distribution of implanted dopants does not have a substantially uniform concentration throughout the implanted region in the channel layer;
a first electrode on the implanted region of the surface layer; and
a second electrode on a non-implanted region of the surface layer that is spaced apart from the implanted region.

2. The device of claim 1, wherein the channel layer and the surface layer comprise a Group III-nitride material, and wherein a dopant concentration of the surface layer is less than that of an entirety of the channel layer.

3. The device of claim 1, wherein the first electrode comprises an ohmic contact extending through the protective layer to the implanted region of the surface layer.

4. The device of claim 3, wherein the protective layer comprises a high purity nitride (HPN).

5. The device of claim 3, wherein the channel and surface layers comprise gallium nitride (GaN), and wherein the protective layer comprises:
   a first protective layer comprising a Group III-nitride including aluminum on the surface layer; and
   a second protective layer comprising a high purity nitride (HPN) on the first protective layer.

6. The device of claim 3, wherein the protective layer comprises silicon nitride (SiN), silicon dioxide ($SiO_2$), and/or silicon oxynitride (SiON).

7. The device of claim 3, wherein the ohmic contact is in direct contact with the protective layer.

8. The device of claim 1, wherein the implanted region has a peak dopant concentration in the surface layer.

9. The device of claim 8, wherein the implanted region has a peak dopant concentration of at least about $5 \times 10^{20}$ ions/$cm^3$.

10. The device of claim 1, wherein the implanted dopants comprise silicon (Si), sulfur (S) and/or oxygen (O).

11. The device of claim 1, wherein the channel layer and the surface layer comprise a same material.

12. The device of claim 1, wherein the first electrode comprises an ohmic contact.

13. The device of claim 1, wherein the first electrode comprises a cathode contact on the implanted region of the surface layer, and wherein the second electrode comprises an anode contact on the non-implanted region of the surface layer.

14. The device of claim 13, wherein the channel layer and/or the surface layer has a thickness of about 100 nanometers (nm) to about 500 nm.

15. The device of claim 1, wherein a lateral distance between the second electrode and the implanted region is less than a lateral distance between the second electrode and the first electrode.

16. The device of claim 15, wherein the lateral distance between the second electrode and the implanted region is less than about 1 micrometer (μm).

17. The device of claim 1, wherein the first electrode comprises a source/drain contact on the implanted region of the surface layer, and wherein the second electrode comprises a gate contact on the non-implanted region of the surface layer.

18. The device of claim 17, wherein a bandgap of the surface layer is greater than a bandgap of the channel layer.

19. A semiconductor device, comprising:
   a conductive channel layer;
   a surface layer on the channel layer including an implanted region therein, the implanted region extending into the surface layer and into the channel layer and including a distribution of implanted dopants having a same conductivity type as that of the channel layer, wherein the implanted region has an implanted dopant concentration of at least about $5 \times 10^{20}$ ions/$cm^3$ at a depth within the implanted region of at least about 1500 Angstroms and a peak implanted dopant concentration in the surface layer, and wherein the surface layer comprises a lower conductivity than an entirety of the channel layer;
   a first electrode on the implanted region of the surface layer; and
   a second electrode on a non-implanted region of the surface layer.

20. The device of claim 19, further comprising:
   an insulating protective layer on the surface layer and having an opening extending therethrough to expose the implanted region of the surface layer,
   wherein the first electrode comprises an ohmic contact extending through the opening in the protective layer to the implanted region of the surface layer.

21. The device of claim 20, wherein the ohmic contact is in direct contact with the protective layer.

22. The device of claim 20, wherein the distribution of implanted dopants extends at least partially into the protective layer.

23. The device of claim 19, wherein the distribution of implanted dopants extends through the surface layer and at least partially into but not completely through a portion of the channel layer.

24. The device of claim 19, wherein the distribution of implanted dopants has a substantially uniform concentration throughout the implanted region of the surface layer.

25. The device of claim 19, wherein the first and second electrodes comprise a same material layer.

26. The device of claim 19, wherein a lateral distance between the second electrode and the implanted region is less than a lateral distance between the second electrode and the first electrode.

27. The device of claim 26, wherein the lateral distance between the second electrode and the implanted region is less than about 1 micrometer (μm).

28. The device of claim 19, wherein the device comprises a diode, wherein the first electrode comprises a cathode contact on the implanted region of the surface layer, and wherein the second electrode comprises an anode contact on the non-implanted region of the surface layer.

29. The device of claim 19, wherein the device comprises a transistor, wherein the first electrode comprises a source/drain contact on the implanted region of the surface layer, and wherein the second electrode comprises a gate contact on the non-implanted region of the surface layer.

30. The device of claim 29, wherein the transistor comprises a high electron mobility transistor (HEMT), and wherein a bandgap of the surface layer is greater than a bandgap of the channel layer such that an interface therebetween defines a heterojunction.

31. The device of claim 19, wherein the channel layer and/or the surface layer comprise a Group III-nitride material, and wherein the surface layer has a lower conductivity than that of the channel layer.

32. The device of claim 1, wherein the first and second electrodes comprise a same material layer.

33. A semiconductor device, comprising:
   a conductive channel layer;
   a surface layer on the channel layer including an implanted region therein, the implanted region extending into the surface layer and into the channel layer and including a distribution of implanted dopants having a same conductivity type as that of the channel layer,
   wherein a portion of the channel layer has a higher conductivity than the surface layer,
   wherein the distribution of implanted dopants has an implanted dopant concentration of at least about $5 \times 10^{20}$ ions/$cm^3$ at a depth within the implanted region of at least about 1500 Angstroms,
   wherein the distribution of implanted dopants has a substantially uniform concentration throughout the implanted region of the surface layer, and
   wherein the distribution of implanted dopants does not have a substantially uniform concentration throughout the implanted region of the channel layer;
   a protective layer on the surface layer, wherein the distribution of implanted dopants extends into the surface layer and partially into a portion of the protective layer;

a first electrode on the implanted region of the surface layer; and a second electrode on a non-implanted region of the surface layer.

34. The device of claim 33, wherein the first electrode comprises an ohmic contact extending through the protective layer to the implanted region of the surface layer.

35. The device of claim 33, wherein the first and second electrodes comprise a same material layer.

36. The device of claim 33, wherein the channel layer and/or the surface layer comprise a Group III-nitride material, and wherein the surface layer has a lower conductivity than an entirety of the channel layer.

37. The device of claim 33, wherein the device comprises a high electron mobility transistor (HEMT), and wherein a bandgap of the surface layer is greater than a bandgap of the channel layer such that an interface therebetween defines a heterojunction.

38. The device of claim 24, wherein the distribution of implanted dopants does not have a substantially uniform concentration throughout a portion of the channel layer.

39. The device of claim 33, wherein the conductive channel layer comprises a buried n+ layer having a dopant concentration of about $1\times10^{19}$ ions/cm$^3$.

40. The device of claim 1, wherein the implanted region extends partially into but not completely through the channel layer.

41. The device of claim 19, wherein the implanted region has a substantially uniform implanted dopant concentration of at least about $5\times10^{20}$ ions/cm$^3$ over at least about 500 Angstroms along the depth.

42. The device of claim 1, wherein:

the channel layer and the surface layer comprise a Group III-nitride channel layer and a Group III-nitride surface layer, respectively;

the distribution of implanted dopants has a substantially uniform concentration throughout the implanted region in the Group III-nitride surface layer; and the distribution of implanted dopants does not have a substantially uniform concentration throughout the implanted region in the Group III-nitride channel layer.

43. The device of claim 33, wherein:

the channel layer and the surface layer comprise a Group III-nitride channel layer and a Group III-nitride surface layer, respectively;

the distribution of implanted dopants has a substantially uniform concentration throughout the implanted region in the Group III-nitride surface layer; and the distribution of implanted dopants does not have a substantially uniform concentration throughout the implanted region in the Group III-nitride channel layer.

* * * * *